United States Patent
Lee et al.

(10) Patent No.: US 9,355,962 B2
(45) Date of Patent: May 31, 2016

(54) INTEGRATED CIRCUIT PACKAGE STACKING SYSTEM WITH REDISTRIBUTION AND METHOD OF MANUFACTURE THEREOF

(75) Inventors: SeongMin Lee, Seoul (KR); Sungmin Song, Inchon (KR); Jong-Woo Ha, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 903 days.

(21) Appl. No.: 12/483,548

(22) Filed: Jun. 12, 2009

(65) Prior Publication Data
US 2010/0314741 A1  Dec. 16, 2010

(51) Int. Cl.
H01L 21/56 (2006.01)
H01L 23/538 (2006.01)
H01L 23/31 (2006.01)
H01L 25/065 (2006.01)
(Continued)

(52) U.S. Cl.
CPC ............ *H01L 23/5389* (2013.01); *H01L 21/56* (2013.01); *H01L 23/3128* (2013.01); *H01L 25/0657* (2013.01); *H01L 25/105* (2013.01); H01L 24/48 (2013.01); H01L 24/73 (2013.01); H01L 2224/16225 (2013.01); H01L 2224/32145 (2013.01); H01L 2224/32225 (2013.01); H01L 2224/48227 (2013.01); H01L 2224/73203 (2013.01); H01L 2224/73204 (2013.01); H01L 2224/73265 (2013.01); H01L 2225/0651 (2013.01); H01L 2225/06517 (2013.01); H01L 2225/06562 (2013.01); H01L 2225/1023 (2013.01); H01L 2225/1058 (2013.01); H01L 2924/15311 (2013.01); H01L 2924/19041 (2013.01)

(58) Field of Classification Search
CPC ... H01L 25/105; H01L 23/5389; H01L 21/56; H05K 1/185–1/188; H05K 3/103; H05K 3/107; H05K 3/20; H05K 3/202; H05K 3/205; H05K 3/207
USPC .......... 257/687, 690, 734, 786, 787, E21.499, 257/E21.502, E21.503, E23.135, E23.136, 257/E23.141, 686; 438/106, 118, 121, 438/125–127, 584, 109
See application file for complete search history.

(56) References Cited

U.S. PATENT DOCUMENTS

| | | | | |
|---|---|---|---|---|
| 5,506,755 | A | * | 4/1996 | Miyagi et al. .................. 361/720 |
| 5,543,661 | A | * | 8/1996 | Sumida ........................... 257/707 |
| 6,038,133 | A | * | 3/2000 | Nakatani ............. G06F 17/3089 174/255 |

(Continued)

FOREIGN PATENT DOCUMENTS

| WO | WO 2006/032250 | * | 3/2006 | ............. H01L 21/48 |
| WO | WO 2006032250 | * | 3/2006 | ............. H01L 21/48 |

OTHER PUBLICATIONS

Office Action/Search Report for TW Application No. 99118682 dated Jan. 21, 2015.

*Primary Examiner* — Victoria K Hall
(74) *Attorney, Agent, or Firm* — Ishimaru & Associates LLP

(57) ABSTRACT

A method of manufacture of an integrated circuit package stacking system including: forming a base frame includes: providing a support panel, and forming a coupling pad, a mounting pad, a base frame trace, a discrete component pad, or a combination thereof on the support panel; fabricating a package substrate; coupling an integrated circuit die to the package substrate; mounting the base frame over the integrated circuit die and the package substrate; and removing the support panel from the base frame.

9 Claims, 5 Drawing Sheets

(51) Int. Cl.
*H01L 25/10* (2006.01)
*H01L 23/00* (2006.01)

(56) References Cited

U.S. PATENT DOCUMENTS

| | | | |
|---|---|---|---|
| 6,734,542 B2 * | 5/2004 | Nakatani et al. | 257/687 |
| 6,784,530 B2 * | 8/2004 | Sugaya et al. | 257/686 |
| 6,794,273 B2 | 9/2004 | Saito et al. | |
| 7,038,310 B1 * | 5/2006 | Nakatani | H01L 21/568 257/690 |
| 7,061,100 B2 * | 6/2006 | Iwaki et al. | 257/706 |
| 7,180,169 B2 * | 2/2007 | Ishimaru et al. | 257/690 |
| 7,185,426 B1 * | 3/2007 | Hiner et al. | 29/841 |
| 7,190,062 B1 * | 3/2007 | Sheridan | H01L 23/3128 257/666 |
| 7,242,081 B1 * | 7/2007 | Lee | 257/686 |
| 7,247,524 B2 | 7/2007 | Nakagawa | |
| 7,271,032 B1 | 9/2007 | McLellan et al. | |
| 7,476,980 B2 * | 1/2009 | Rebibis et al. | 257/782 |
| 7,538,565 B1 | 5/2009 | Beaman et al. | |
| 7,548,430 B1 * | 6/2009 | Huemoeller | H01L 21/4857 174/262 |
| 7,629,674 B1 * | 12/2009 | Foster | H01L 21/56 257/659 |
| 7,633,765 B1 * | 12/2009 | Scanlan | H01L 21/4857 174/262 |
| 7,687,899 B1 * | 3/2010 | Berry | H01L 21/561 257/687 |
| 7,777,351 B1 * | 8/2010 | Berry et al. | 257/778 |
| 7,790,515 B2 * | 9/2010 | Jobetto | 438/127 |
| 7,898,093 B1 * | 3/2011 | Darveaux | H01L 21/56 257/678 |
| 8,338,936 B2 * | 12/2012 | Pressel et al. | 257/691 |
| 9,252,032 B2 * | 2/2016 | Choi | H01L 21/565 |
| 9,252,065 B2 * | 2/2016 | Lin | H01L 23/3107 |
| 2001/0030059 A1 * | 10/2001 | Sugaya et al. | 174/256 |
| 2002/0135058 A1 * | 9/2002 | Asahi | H01L 23/5389 257/687 |
| 2003/0090883 A1 * | 5/2003 | Asahi | H01L 21/6835 361/761 |
| 2004/0227251 A1 * | 11/2004 | Yamaguchi | H01L 21/56 257/777 |
| 2005/0001331 A1 * | 1/2005 | Kojima | H01L 23/3121 257/778 |
| 2005/0029642 A1 * | 2/2005 | Takaya | H01L 23/5389 257/678 |
| 2005/0151235 A1 * | 7/2005 | Yokoi | H01L 21/565 257/685 |
| 2005/0168960 A1 * | 8/2005 | Asahi | H01L 21/6835 361/761 |
| 2006/0120056 A1 * | 6/2006 | Sasaki | H01L 23/3107 361/735 |
| 2007/0262435 A1 * | 11/2007 | Lam | 257/686 |
| 2007/0290322 A1 * | 12/2007 | Zhao et al. | 257/690 |
| 2007/0290376 A1 * | 12/2007 | Zhao et al. | 257/787 |
| 2008/0111233 A1 * | 5/2008 | Pendse | 257/712 |
| 2008/0136007 A1 | 6/2008 | Kim et al. | |
| 2008/0230898 A1 * | 9/2008 | Meguro et al. | 257/737 |
| 2008/0315399 A1 * | 12/2008 | Bauer et al. | 257/698 |
| 2009/0096097 A1 * | 4/2009 | Kagaya | H01L 21/6835 257/737 |
| 2009/0115044 A1 * | 5/2009 | Hoshino | H01L 23/5389 257/686 |
| 2009/0184412 A1 * | 7/2009 | Yasunaga | H01L 23/3128 257/693 |
| 2009/0206461 A1 * | 8/2009 | Yoon | H01L 21/565 257/686 |
| 2010/0025833 A1 * | 2/2010 | Pagaila | H01L 21/561 257/686 |
| 2010/0033941 A1 * | 2/2010 | Pagaila et al. | 361/809 |
| 2010/0044845 A1 * | 2/2010 | Funaya | H01L 21/6835 257/685 |
| 2010/0140780 A1 * | 6/2010 | Huang et al. | 257/690 |
| 2010/0244222 A1 * | 9/2010 | Chi et al. | 257/690 |
| 2010/0314780 A1 * | 12/2010 | Camacho | H01L 21/561 257/777 |
| 2011/0316117 A1 * | 12/2011 | Kripesh et al. | 257/531 |

\* cited by examiner

INTEGRATED CIRCUIT PACKAGE STACKING SYSTEM WITH REDISTRIBUTION AND METHOD OF MANUFACTURE THEREOF

TECHNICAL FIELD

The present invention relates generally to an integrated circuit packaging system, and more particularly to a system for stacking known good integrated circuit packages.

BACKGROUND ART

Many of today's shrinking consumer electronic devices, such as cellular telephones, digital video cameras, global positioning systems, personal audio/video players, and personal data assistants, require many functions to be packaged in a very small area of a printed wiring board. In attempting to use the area on the printed wiring boards more efficiently, semiconductor chip manufacturers have recently been switching from larger, more cumbersome interconnection conventions, such as pin grid arrays ("PGA.s") and the perimeter leaded quad flat packs ("QFPs"), to smaller conventions, such as ball grid arrays ("BGAs"). Using BGA technology, semiconductor chips are typically interconnected to their supporting substrates using solder connections, such as with "flip-chip" technology. However, when solder alone is used to interconnect the chip contacts to the substrate, the columns of solder are generally designed to be short to maintain the solder's structural integrity, which results in minimal elastic solder connection properties which further results in increased susceptibility to solder cracking due to the mechanical stress of the differential coefficient of thermal expansion ("CTE") of the chip relative to the supporting substrate thereby reducing the reliability of the solder joint.

In other words, when the chip heats up during use, both the chip and the substrate expand; and when the heat is removed, both the chip and the substrate contract. The problem that arises is that the chip and the substrate expand and contract at different rates and at different times, thereby stressing the interconnections between them. As the features of semiconductor chips continue to be reduced in size, the number of chips packed into a given area will be greater and the heat dissipated by the each of these chips will have a greater effect on the thermal mismatch problem. This further increases the need for a highly compliant interconnection scheme for the chips.

The solder cracking problem is exacerbated when more than one semiconductor chip is mounted in a package, such as in a multichip module. Multichip modules continue to grow in popularity; however, as more chips are packaged together, more heat will be dissipated by each package which, in turn, means the interconnections between a package and its supporting substrate will encounter greater mechanical stress due to thermal cycling. Further, as more chips are integrated into multichip modules, each package requires additional interconnections thereby increasing overall rigidity of the connection between the module and its supporting substrate.

Another issue for the multichip modules is manufacturability. As the number of integrated circuits in the package increases, it becomes more difficult to achieve good manufacturing yields. A single failed component included in the stack will make the entire stack bad. With the increasing number of functions included in the most popular consumer electronic devices, it becomes imperative that the manufacturing yield be optimized.

Thus, a need still remains for an integrated circuit package stacking system. In view of the constant demand for more functions in less space on the printed wiring boards, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package stacking system including: forming a base frame includes: providing a support panel, and forming a coupling pad, a mounting pad, a base frame trace, a discrete component pad, or a combination thereof on the support panel; fabricating a package substrate; coupling an integrated circuit die to the package substrate; mounting the base frame over the integrated circuit die and the package substrate; and removing the support panel from the base frame.

The present invention provides an integrated circuit package stacking system including: a package substrate; an integrated circuit die coupled to the package substrate; and a planar surface over the integrated circuit die and the package substrate, includes a coupling pad, a mounting pad, a base frame trace, a discrete component pad, or a combination thereof.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
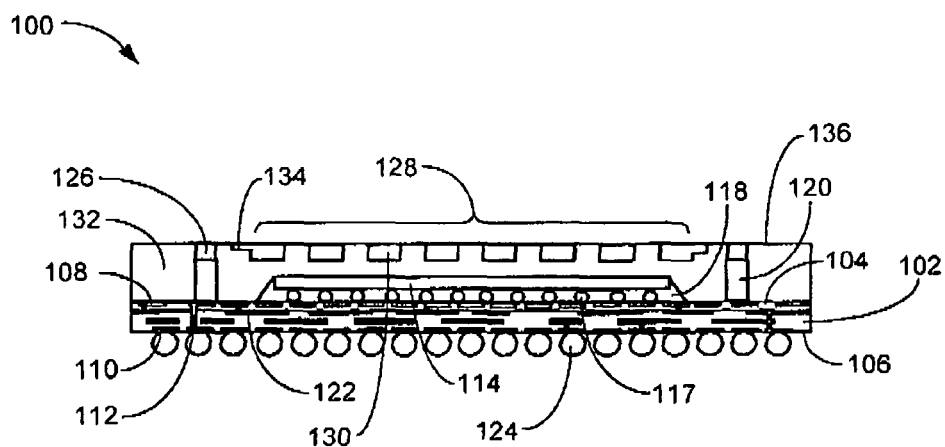
FIG. 1 is a cross-sectional view of an integrated circuit package stacking system with redistribution in an embodiment of the present invention, as viewed along the section line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, planarization, and/or removal of the material or photoresist as required in forming a described structure.

Figure 2:
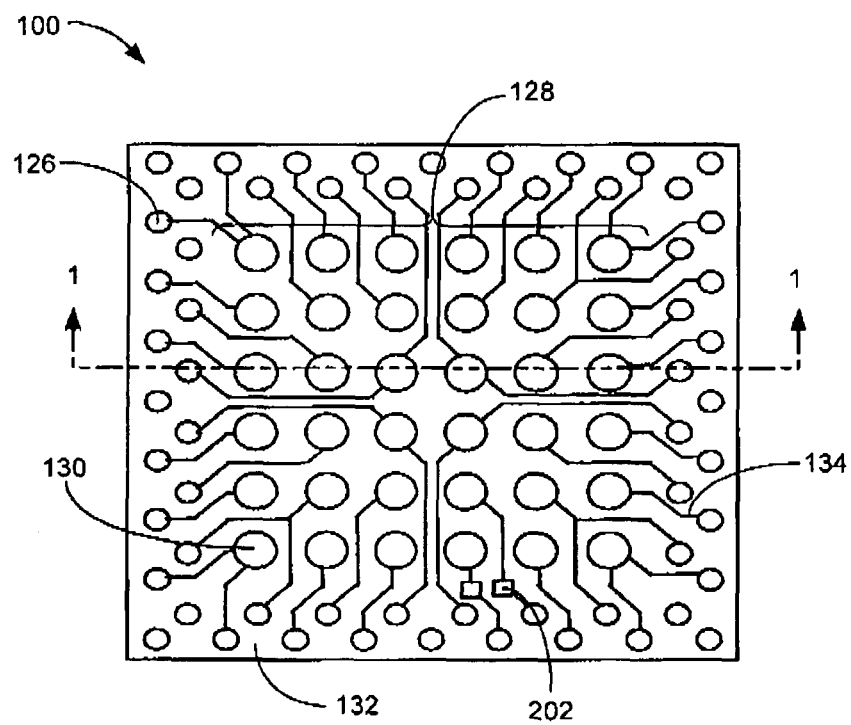
FIG. 2 is a top view of the integrated circuit package stacking system with redistribution in an embodiment of the present invention.

Referring now to FIG. 1, therein is shown a cross-sectional view of an integrated circuit package stacking system 100 with redistribution in an embodiment of the present invention, as viewed along the section line 1-1 of FIG. 2. The cross-sectional view of the integrated circuit package stacking system 100 depicts a package substrate 102 having a component side 104 and a system side 106.

Contact pads 108 on the component side 104 may be coupled to system contact pads 110, on the system side 106, by plated vias 112. An integrated circuit die 114, such as a flip chip integrated circuit die, may be coupled to the component side 104 by chip interconnects 117. An adhesive 118, such as an underfill adhesive or a die attach adhesive, may be applied between the component side 104 and the integrated circuit die 114.

Conductive posts 120, such as a solder column, may be coupled to the contact pads 108 on the component side 104. The conductive posts 120 can be formed on the package substrate 102, the integrated circuit die 114, or a combination thereof. The conductive posts 120 may be electrically connected to the integrated circuit die 114, the system contact pads 110, or a combination thereof, by internal traces 122 of the package substrate 102. System interconnects 124, such as solder balls, solder columns, solder bumps, or stud bumps, may be formed on the system contact pads 110 for connecting to the next level system, such as a printed circuit board, not shown.

Coupling pads 126 may be electrically connected to the conductive posts 120 by a reflow process. An array 128 of mounting pads 130 may be formed over the integrated circuit die 114 and held in position by a molded package body 132. The mounting pads 130 may be electrically connected to the coupling pads 126 by base frame traces 134. A planar surface 136 may be formed of the coupling pads 126, the mounting pads 130, the molded package body 132, and the base frame traces 134.

It is understood that the configuration described is an example only and the number and position of the coupling pads 126, the mounting pads 130, and the base frame traces 134 may differ. It is further understood that the application of the adhesive 118 is optional and may be replaced by the packaging material used to form the molded package body 132.

It has been discovered that the present invention may simplify the package assembly process by removing the need for via forming and filling in the integrated circuit package stacking system 100. Further it has been discovered that the base frame traces 134 may be routed by an auto-router program in order to increase the input/output capacity of a second integrated circuit package (not shown) coupled to the mounting pads 130. This may simplify the design of a host printed circuit board (not shown) because many of the interconnections between the integrated circuit die 114 and the second integrated circuit package do not go through the host printed circuit board resulting in a smaller area required on the host printed circuit board.

Referring now to FIG. 2, therein is shown a top view of the integrated circuit package stacking system 100 with redistribution in an embodiment of the present invention. The top view of the integrated circuit package stacking system 100 depicts the coupling pads 126 formed in offset rows around the mounting pads 130.

The base frame traces 134 may interconnect the coupling pads 126 and the mounting pads 130. The shape, size, and position of the base frame traces 134 are an example only and may differ in various implementations. The base frame traces 134 are exposed from the molded package body 132 and are plainly visible in the top view.

The base frame traces 134 may include discrete component pads 202, which may provide an inexpensive alternative for termination or filtering. The discrete component pads 202 may be suitable for coupling discrete components, such as resistors, capacitors, inductors, or diodes.

The section line 1-1 shows the position and direction of view of the cross-sectional view of FIG. 1. It is also generally used to display other of the cross-sectional views in the application.

Figure 3:
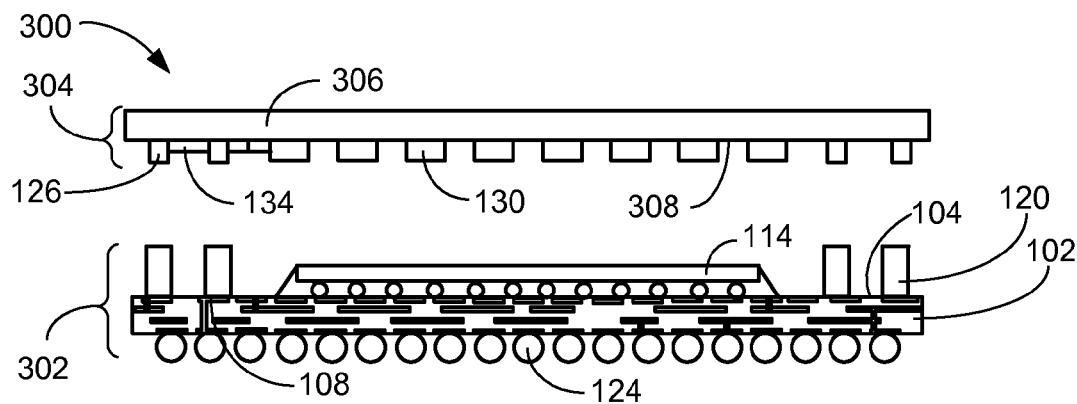
FIG. 3 is a cross-sectional view of an integrated circuit package stacking system with redistribution in an assembly phase of manufacturing.

Referring now to FIG. 3, therein is shown a cross-sectional view of an integrated circuit package stacking system 300 with redistribution in an assembly phase of manufacturing. The cross-sectional view of the integrated circuit package stacking system 300 depicts the package substrate 102 with the integrated circuit die 114 coupled to the component side 104.

The conductive posts 120 may be mounted and electrically connected to the contact pads 108 on the component side 104. A substrate assembly 302 having the integrated circuit die 114, the conductive posts 120, and the system interconnects 124 may be electrically tested prior to further assembly in order to provide enhanced manufacturing yields.

A base frame 304 may be formed of a support panel 306, such as aluminum, copper, or silicon panel, a tape substrate, or ceramic carrier, having a planar area 308. The coupling pads 126, the mounting pads 130, the discrete component pads 202, of FIG. 2, and the base frame traces 134 may be formed thereon. The coupling pads 126, the mounting pads 130, the discrete component pads 202, and the base frame traces 134 may be formed by masking and deposition of a patterned layer of conductive material on the planar area 308 of the support panel 306.

The base frame traces 134 are shown as having a different vertical dimension than the coupling pads 126 and the mounting pads 130, but this is an example only and the actual dimensions may differ. It is also understood that the vertical dimensions of the mounting pads 130 may differ from the coupling pads 126. In some instances the coupling pads 126 may also be used as the mounting pads 130.

Figure 4:
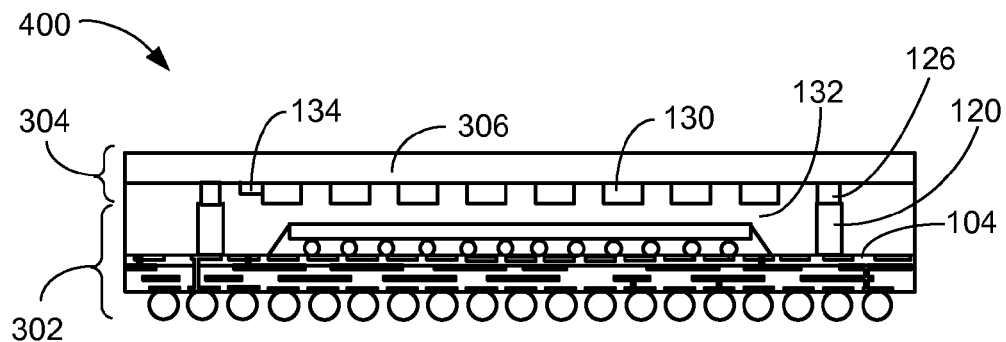
FIG. 4 is a cross-sectional view of an integrated circuit package stacking system with redistribution in a molding phase of manufacturing.

Referring now to FIG. 4, therein is shown a cross-sectional view of an integrated circuit package stacking system 400 with redistribution in a molding phase of manufacturing. The cross-sectional view of the integrated circuit package stacking system 400 depicts the base frame 304 mounted on and electrically connected to the conductive posts 120.

The molded package body 132 may be formed by injecting an epoxy molding compound between the component side 104 and the support panel 306. The molded package body 132 is formed around the coupling pads 126, the mounting pads 130, and the base frame traces 134 while completely encasing the conductive posts 120 and the integrated circuit die 114.

In a subsequent step the support panel 306 is dissolved or completely removed from above the molded package body 132. The support panel 306 may be dissolved or removed by a number of possible etching or planarization steps. The removal of the support panel leaves the mounting pads 130, the discrete component pads 202, of FIG. 2, and the base frame traces 134 supported by and exposed from the molded package body 132.

By dissolving the support panel 306, the integrated circuit package stacking system 100 is produced. This process provides low profile package stacking system capable of mounting a second integrated circuit package (not shown) on the mounting pads 130.

Figure 5:
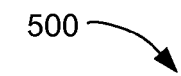
FIG. 5 is a cross-sectional view of a package-on-package stack having the integrated circuit package stacking system with redistribution, in an embodiment of the present invention.
Figure 5:
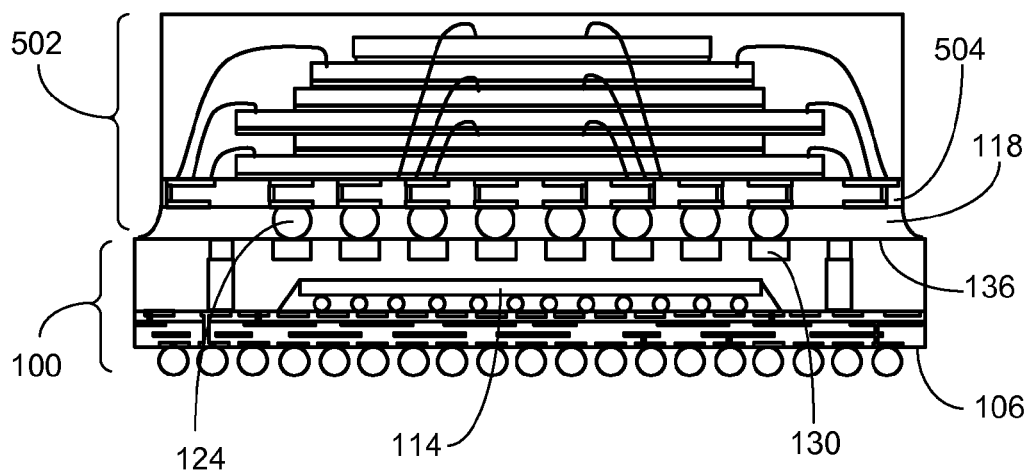

Referring now to FIG. 5, therein is shown a cross-sectional view of a package-on-package stack 500 having the integrated circuit package stacking system 100 with redistribution, in an embodiment of the present invention. The cross-sectional view of the package-on-package stack 500 depicts the integrated circuit package stacking system 100 of the present invention having a second integrated circuit package 502 coupled to the mounting pads 130 by the system interconnects 124. The adhesive 118 may optionally be applied between the planar surface 136 and a second package substrate 504.

The second integrated circuit package 502 may have multiple stacked die as shown or there may be a single die with discrete components, such as resistors, capacitors, inductors, diodes, voltage regulators, or the like packaged therein. The contents of the second integrated circuit package 502 may be electrically connected to the system interconnects 124, on the system side 106 of the package substrate 102, the integrated circuit die 114, or a combination thereof.

While the second integrated circuit package 502 is shown to have a shorter horizontal dimension, this is an example only and the actual package dimensions may differ. The second integrated circuit package 502 is shown to have six stacked integrated circuit dice, but this is only an example and may differ.

The package-on-package stack 500 provides a fan-in platform that may reduce the number of input/output pads on the host printed circuit board (not shown). Since many of the signal interconnects will have a shorter distance to travel between the second integrated circuit package 502 and the integrated circuit die 114, signal quality and performance will be improved.

Figure 6:
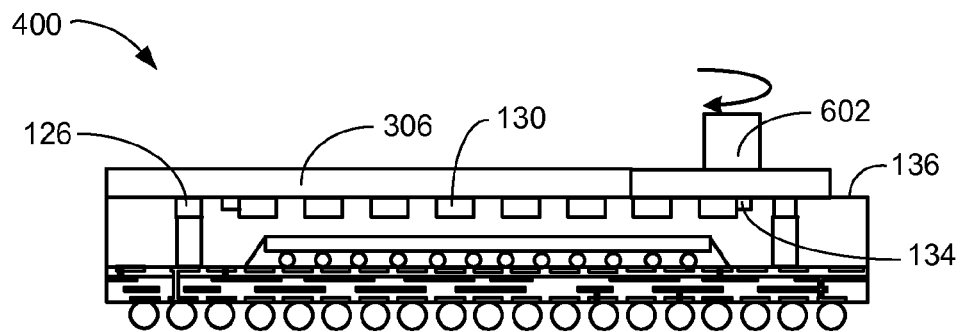
FIG. 6 is a cross-sectional view of the integrated circuit package stacking system with redistribution in a planarization phase of manufacturing.

Referring now to FIG. 6, therein is shown a cross-sectional view of the integrated circuit package stacking system 400 with redistribution in a planarization phase of manufacturing. The cross-sectional view of the integrated circuit package stacking system 400 depicts a planarization tool 602 which may be used to remove the support panel 306.

A chemical-mechanical planarization (CMP) process may be applied to the integrated circuit package stacking system 400 in order to produce the planar surface 136. Certain of the possible materials for the support panel 306 may be optimized for the CMP process.

Other materials may utilize other mechanisms to remove the support panel 306 from the planar surface 136, such as chemical etching, dissolving in an aqueous solution, Ultraviolet release, or thermal shear. The relative size of the support panel 306, the coupling pads 126, the mounting pads 130, and the base frame traces 134 is an example only and they may differ in an actual implementation.

Figure 7:
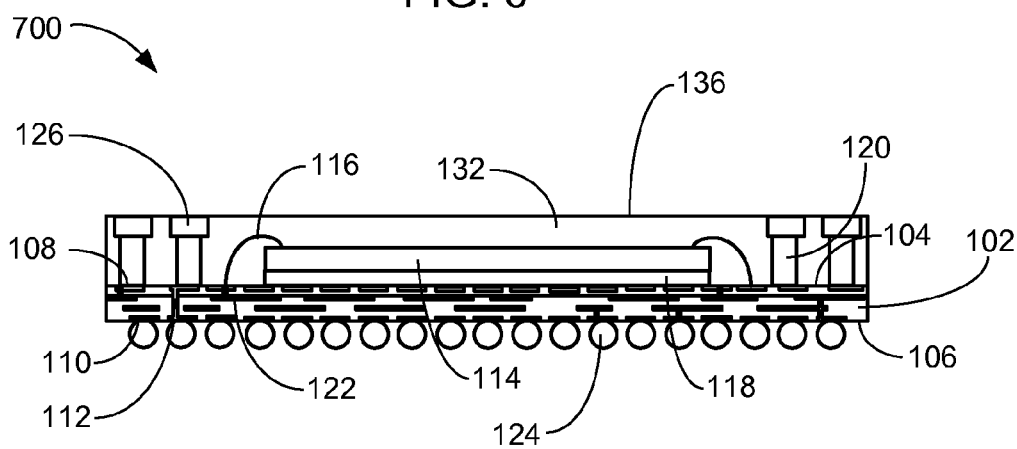
FIG. 7 is a cross-sectional view of an integrated circuit package stacking system in a first alternative embodiment of the present invention.

Referring now to FIG. 7, therein is shown a cross-sectional view of an integrated circuit package stacking system 700 in a first alternative embodiment of the present invention. The cross-sectional view of the integrated circuit package stacking system 700 depicts the package substrate 102 having the component side 104 and the system side 106.

The contact pads 108 on the component side 104 may be coupled to the system contact pads 110, on the system side 106, by the plated vias 112. The integrated circuit die 114, such as a wire bond integrated circuit die, may be coupled to the component side 104 by the chip interconnects 116. The adhesive 118, such as an underfill adhesive or a die attach adhesive, may be applied between the component side 104 and the integrated circuit die 114.

The conductive posts 120, such as a solder column, may be coupled to the contact pads 108 on the component side 104. The conductive posts 120 may be electrically connected to the integrated circuit die 114, the system contact pads 110, or a combination thereof, by the internal traces 122 of the package substrate 102. The system interconnects 124, such as solder balls, solder columns, solder bumps, or stud bumps, may be formed on the system contact pads 110 for connecting the next level system, such as a host printed circuit board, not shown.

The coupling pads 126 may be electrically connected to the conductive posts 120 by a reflow process. The molded package body 132 may be formed by injecting an epoxy molding compound on the component side 104, the integrated circuit die 114, the chip interconnects 116, the adhesive 118, the conductive posts 120, and the coupling pads 126. The planar surface 136 may be formed of the coupling pads 126 and the molded package body 132.

It is understood that the configuration described is an example only and the number and position of the coupling pads 126, the mounting pads 130, and the base frame traces 134 may differ. It is further understood that the application of the adhesive 118 is optional and may be replaced by the packaging material used to form the molded package body 132.

It has been discovered that the present invention may simplify the package assembly process by removing the need for via forming and filling in the integrated circuit package stacking system 700. This may simplify the design of a host printed circuit board (not shown) because many of the interconnections between the integrated circuit die 114 and the second integrated circuit package (not shown) do not go through the host printed circuit board resulting in a smaller area required on the host printed circuit board.

Figure 8:
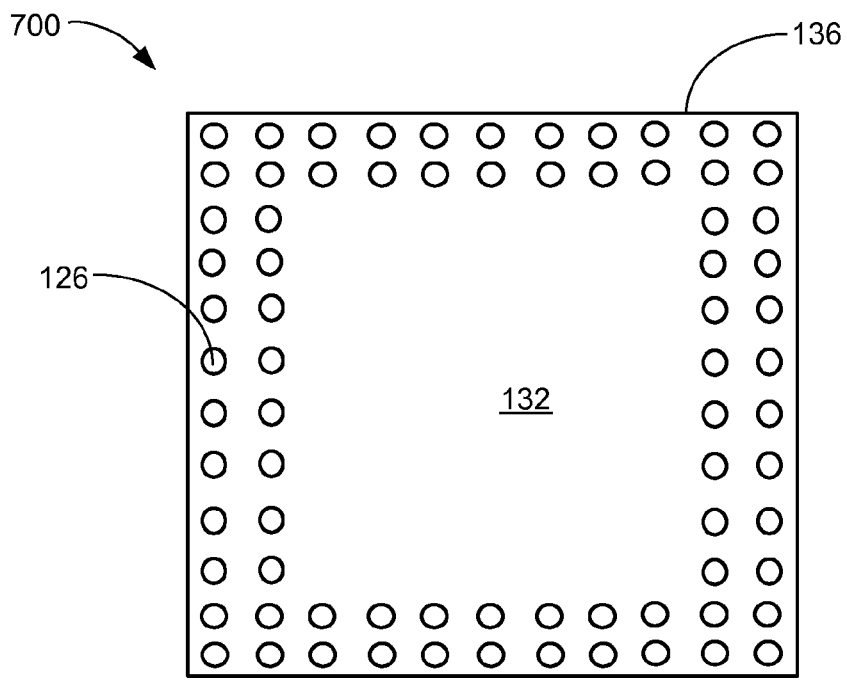
FIG. 8 is a top view of the integrated circuit package stacking system in the first alternative embodiment of the present invention.

Referring now to FIG. 8, therein is shown a top view of the integrated circuit package stacking system 700 in the first alternative embodiment of the present invention. The top view of the integrated circuit package stacking system 700 depicts a double row of the coupling pads 126 present on the planar surface 136 with the molded package body 132.

The number and position of the coupling pads 126 is an example only and the actual number and position may differ. The size, shape and alignment of the coupling pads 126 may also differ from the example.

In this configuration a stacked integrated circuit package (not shown) may be mounted to the coupling pads 126. The conductive posts 120 and the package substrate may still provide an electrical connection between the coupling pads 126, the system interconnects 124, the integrated circuit die 114, or a combination thereof.

Figure 9:
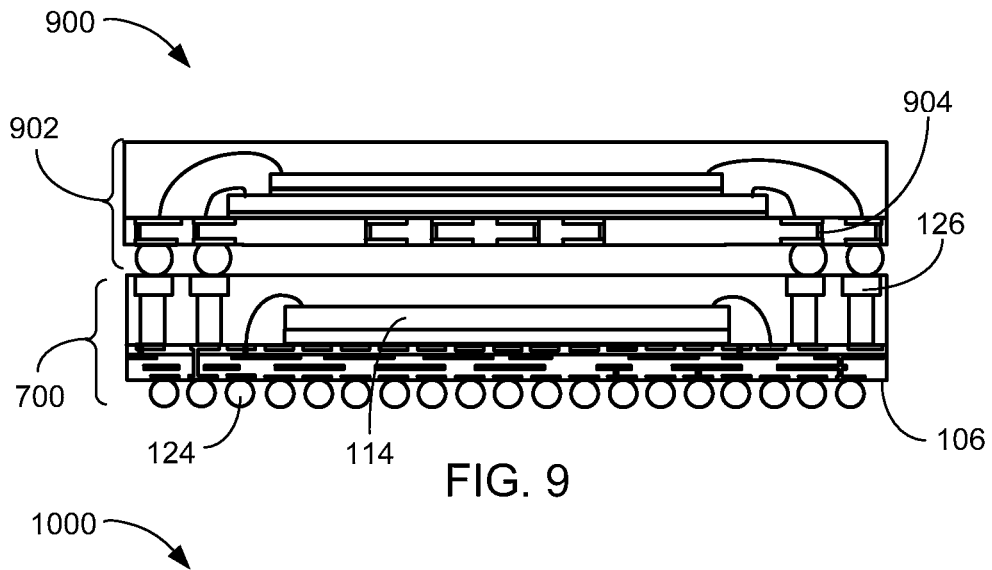
FIG. 9 is a cross-sectional view of a package-on-package stack having the integrated circuit package stacking system, in a first alternative embodiment of the present invention.

Referring now to FIG. 9, therein is shown a cross-sectional view of a package-on-package stack 900 having the integrated circuit package stacking system 700, in a first alternative embodiment of the present invention. The cross-sectional view of the package-on-package stack 900 depicts the integrated circuit package stacking system 700 of the present invention having a stacked integrated circuit package 902 coupled to the coupling pads 126 by the system interconnects 124.

The stacked integrated circuit package 902 may have multiple stacked die as shown or there may be a single die with discrete components, such as resistors, capacitors, inductors, diodes, voltage regulators, or the like packaged therein. The substrate of the stacked integrated circuit package 902 can include through vias 904 for providing top contacts and bottom contacts of the substrate. The through vias 904 on the periphery of the substrate can provide electrical access to the multiple stacked die. The top contacts, the through vias 904, and the bottom contacts on the central region of the substrate can provide electrical or thermal connectivity. The contents of the stacked integrated circuit package 902 may be electrically connected to the system interconnects 124, on the system side 106 of the package substrate 102, the integrated circuit die 114, or a combination thereof.

While the stacked integrated circuit package 902 is shown to be of an equal horizontal dimension, this is an example only and the actual package dimensions may differ. The stacked integrated circuit package 902 is shown to have two stacked integrated circuit dice, but this is only an example and may differ.

The package-on-package stack 900 provides a fan-in platform that may reduce the number of input/output pads on the host printed circuit board (not shown). Since many of the signal interconnects will have a shorter distance to travel between the second integrated circuit package 902 and the integrated circuit die 114, signal quality and performance will be improved.

Figure 10:
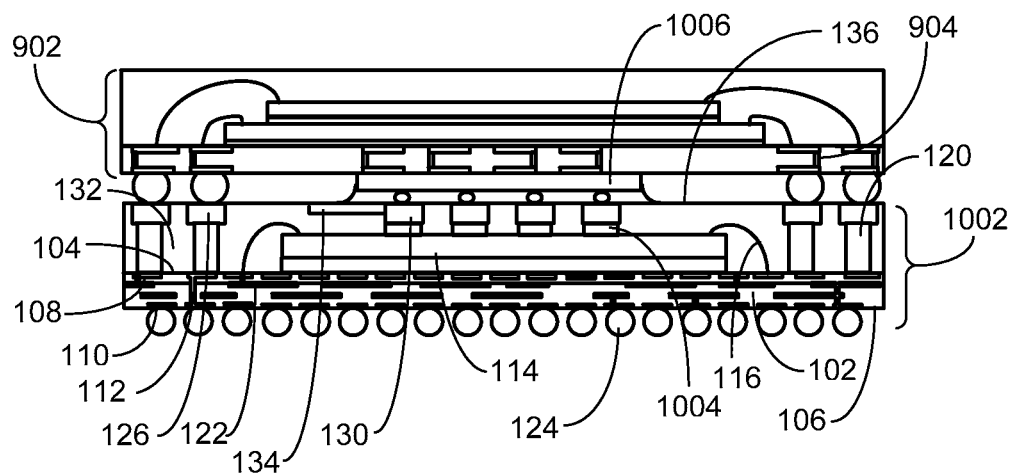
FIG. 10 is a cross-sectional view of a package-on-package stack having an integrated circuit package stacking system, in a second alternative embodiment of the present invention.

Referring now to FIG. 10, therein is shown a cross-sectional view of a package-on-package stack 1000 having an integrated circuit package stacking system 1002, in a second alternative embodiment of the present invention. The cross-sectional view of the package-on-package stack 1000 depicts the integrated circuit package stacking system 1002 including the package substrate 102 having the component side 104 and the system side 106.

The contact pads 108 on the component side 104 may be coupled to the system contact pads 110, on the system side 106, by the plated vias 112. The integrated circuit die 114, such as a wire bond integrated circuit die, may be coupled to the component side 104 by the chip interconnects 116. The adhesive 118, such as an underfill adhesive or a die attach adhesive, may be applied between the component side 104 and the integrated circuit die 114.

The conductive posts 120, such as a solder column, may be coupled to the contact pads 108 on the component side 104. The conductive posts 120 may be electrically connected to the integrated circuit die 114, the system contact pads 110, or a combination thereof, by the internal traces 122 of the package substrate 102. The system interconnects 124, such as solder balls, solder columns, solder bumps, or stud bumps, may be formed on the system contact pads 110 for connecting the next level system, such as a host printed circuit board, not shown.

The coupling pads 126 may be electrically connected to the conductive posts 120 by a reflow process. The mounting pads 130 may be formed over the integrated circuit die 114 and held in position by the molded package body 132. The mounting pads 130 may be electrically connected to the coupling pads 126 by the base frame traces 134, to conductive posts 1004, which may be coupled to contacts on the active side of the integrated circuit die 114, or a combination thereof.

The molded package body 132 may be formed by injecting an epoxy molding compound on the component side 104, the integrated circuit die 114, the chip interconnects 116, the adhesive 118, the conductive posts 120, the coupling pads 126, the mounting pads 130, the conductive posts 1004, and the base frame traces 134. The planar surface 136 may be formed of the coupling pads 126, the mounting pads 130, the base frame traces 134, and the molded package body 132.

The vertical dimensions of the conductive posts 1004 are an example only and the actual dimensions may differ. This direct connection between the mounting pads 130 and the integrated circuit die 114 may provide a very short signal path for a first stacked integrated circuit 1006, such as a flip chip die or chip scale package. The first stacked integrated circuit 1006 is on the mounting pads 130, wherein the mounting pads 130 are directly on the conductive posts 1004 of the integrated circuit package stacking system 1002 and the conductive posts 1004 are directly on the integrated circuit die 114.

The stacked integrated circuit package 902 may be electrically connected to the coupling pads 126 and positioned over the first stacked integrated circuit 1006. This configuration may provide an electrical connection between the stacked integrated circuit package 902, the first stacked integrated circuit 1006, the integrated circuit die 114, the system interconnects 124 on the system side of the package substrate 102, or a combination thereof. An inactive side of the first stacked integrated circuit 1006 can be in direct physical contact with the bottom contacts of the substrate of the stacked integrated circuit package 902. The direct physical contact can prevent collapse of the system interconnects 124 during the mounting of the stacked integrated circuit package 902 and promote thermal transfer, from the first stacked integrated circuit 1006 to the bottom contacts in the central region of the substrate of the stacked integrated circuit package 902, during operation.

It has been discovered that the integrated circuit package stacking system 1002 may provide a highly reliable and high performance package-on-package structure for high volume manufacturing. Each of the integrated circuit die 114, the first stacked integrated circuit 1006, and the stacked integrated circuit package may be tested prior to assembly for providing a known good device and assuring good manufacturing yields.

It is understood that the stacked integrated circuit package 902 may be any package configuration that will fit on the combination of the coupling pads 126, the mounting pads 130 and the discrete component pads 202, of FIG. 2. It is further understood that any combination of the coupling pads 126, the mounting pads 130 and the discrete component pads 202 may be present in the integrated circuit package stacking system 1002.

Figure 11:
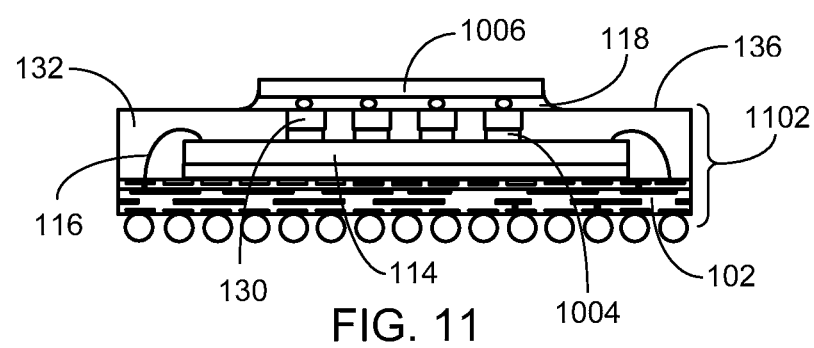
FIG. 11 is a cross-sectional view of a package-on-package stack having an integrated circuit package stacking system, in a third alternative embodiment of the present invention.

Referring now to FIG. 11, therein is shown a cross-sectional view of a package-on-package stack 1100 having an integrated circuit package stacking system 1102, in a third alternative embodiment of the present invention. The cross-sectional view of the package-on-package stack 1100 depicts the integrated circuit package stacking system 1102 having the package substrate 102 with the integrated circuit die 114 mounted thereon by the adhesive 118.

The chip interconnects 116 electrically connect the integrated circuit die 114 to the contact pads 108 on the package substrate 102. The conductive posts 1004 may be coupled on the integrated circuit die 114 to support the mounting pads 130. The planar surface 136 may include the mounting pads 130 and the molded package body 132. The planar surface 136 may optionally include the base frame traces 134, of FIG. 1, the coupling pads 126, of FIG. 1, the discrete component pads 202, of FIG. 2, or a combination thereof.

The first stacked integrated circuit 1006 may be electrically connected to the mounting pads 130 by the chip interconnects 116. The adhesive 118 may optionally be applied between the planar surface 136 and the first stacked integrated circuit 1006.

It has been discovered that the integrated circuit package stacking system 1102 may reduce the area required on the host printed circuit board (not shown) by supporting the integration of flip chip die, discrete components, and stacked packages without requiring any additional geometry. This invention also removes the requirement for any post molding processing which may adversely affect the reliability of the integrated circuit structure.

Figure 12:
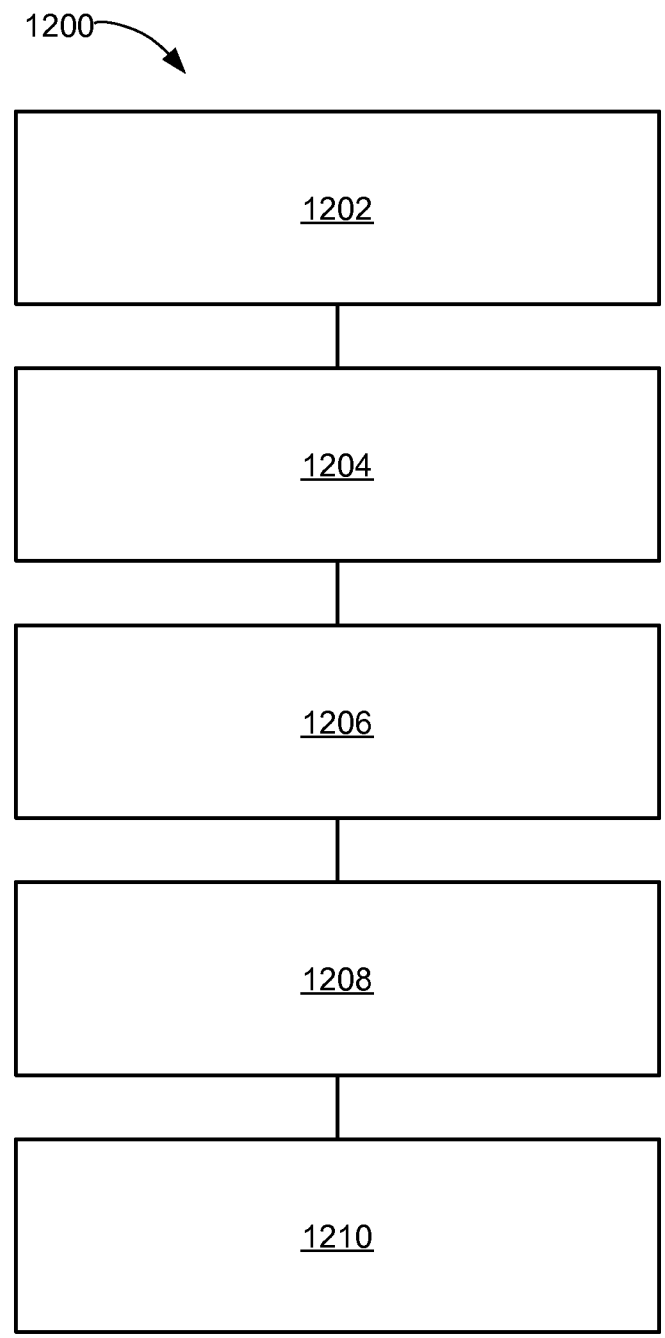
FIG. 12 is a flow chart of a method of manufacture of an integrated circuit package stacking system in an embodiment of the present invention.

Referring now to FIG. 12, therein is shown a flow chart of a method 1200 of manufacture of an integrated circuit package stacking system in an embodiment of the present invention. The method 1200 includes: forming a base frame includes: providing a support panel, and forming a coupling pad, a mounting pad, a base frame trace, a discrete component pad, or a combination thereof on the support panel in a block 1202; fabricating a package substrate in a block 1204; coupling an integrated circuit die to the package substrate in a block 1206; mounting the base frame over the integrated circuit die and the package substrate in a block 1208; and removing the support panel from the base frame in a block 1210.

Thus, it has been discovered that the integrated circuit package stacking system and device or product of the present invention furnishes important and heretofore unknown and unavailable solutions, capabilities, and functional aspects for manufacturing high volume and high performance package-on-package structures.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing high density integrated circuit systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package stacking system comprising:
    a first package having:
        a first substrate;
        a first integrated circuit die coupled to the first substrate;
        a molded package body on the first integrated circuit die;
        a planar surface over the first integrated circuit die and the first substrate, the planar surface formed of the molded package body including a mounting pad, a coupling pad, and a base frame trace, a discrete component pad in the base frame trace, or a combination thereof exposed from within the molded package body;
        a plurality of system interconnects mounted on the planar surface;
    a second package having:
        a second substrate having top contacts and bottom contacts connected by through vias;
        a second integrated circuit die coupled to the top contacts of the second substrate;
    wherein the second substrate is mounted over and coupled to the plurality of system interconnects; and
    a third integrated circuit die electrically connected to the first integrated circuit die, the second integrated circuit die, and the system interconnects through the mounting pad, the base frame trace, the coupling pad, a conductive post, or a combination thereof in the first package, wherein an inactive side of the third integrated circuit die in direct contact with the bottom contacts of the second substrate.

2. The system as claimed in claim 1 further comprising a first adhesive between the first integrated circuit die and the first substrate, and a second adhesive between the planar surface and the third integrated circuit die.

3. The system as claimed in claim 1 wherein the molded package body is on the first substrate.

4. The system as claimed in claim 1 wherein the first package includes the conductive post on the first substrate or the first integrated circuit die.

5. An integrated circuit package stacking system comprising:
- a first package having:
  - a first substrate;
  - a first integrated circuit die coupled to the first substrate;
  - a molded package body on the first integrated circuit die;
  - a planar surface over the first integrated circuit die and the first substrate, the planar surface formed of the molded package body including a mounting pad, a coupling pad, and a base frame trace, a discrete component pad in the base frame trace, or a combination thereof exposed from within the molded package body;
  - a plurality of system interconnects mounted on the planar surface;
- a second package having:
  - a second substrate having top contacts and bottom contacts connected by through vias;
  - a second integrated circuit die coupled to the top contacts of the second substrate;
- wherein the second substrate is mounted over and coupled to the plurality of system interconnects;
- a third integrated circuit die electrically connected to the first integrated circuit die, the second integrated circuit die, and the system interconnects through the mounting pad, the base frame trace, the coupling pad, a conductive post, or a combination thereof in the first package, wherein an inactive side of the third integrated circuit die in direct contact with the bottom contacts of the second substrate;
- contact pads and system contact pads on the first substrate;
- chip interconnects coupled between the first integrated circuit die and the contact pads of the first substrate; and
- wherein:
  - the coupling pad, the mounting pad, the base frame trace, the discrete component pad, or a combination thereof includes a conductive material patterned and suspended over the first integrated circuit die.

6. The system as claimed in claim 5 further comprising a first adhesive between the first integrated circuit die and the first substrate, and a second adhesive between the planar surface and the third integrated circuit die.

7. The system as claimed in claim 5 wherein the molded package body on the first substrate includes an epoxy molding compound on the first substrate, the first integrated circuit die, the chip interconnects, the conductive post, the coupling pads, the mounting pads, and the base frame traces, the discrete component pads, or a combination thereof.

8. The system as claimed in claim 5 wherein the first package includes the conductive post on the first substrate or the first integrated circuit die, to provide an electrical connection to the coupling pad the mounting pad, the base frame trace, the discrete component pad, or the combination thereof.

9. The system as claimed in claim 5 wherein the third integrated circuit die is electrically connected to the coupling pad, the mounting pad, or a combination thereof.

* * * * *